(12) United States Patent
Oh et al.

(10) Patent No.: US 11,763,959 B2
(45) Date of Patent: Sep. 19, 2023

(54) ELECTROCONDUCTIVE PARTICLES AND SIGNAL-TRANSMITTING CONNECTOR HAVING SAME

(71) Applicant: TSE CO., LTD., Chungcheongnam-do (KR)

(72) Inventors: Chang Su Oh, Chungcheongnam-do (KR); Bo Hyun Kim, Chungcheongnam-do (KR); Sung Ho Yoon, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 310 days.

(21) Appl. No.: 17/289,023

(22) PCT Filed: Oct. 23, 2019

(86) PCT No.: PCT/KR2019/014008
§ 371 (c)(1),
(2) Date: Apr. 27, 2021

(87) PCT Pub. No.: WO2020/096238
PCT Pub. Date: May 14, 2020

(65) Prior Publication Data
US 2022/0005626 A1    Jan. 6, 2022

(30) Foreign Application Priority Data
Nov. 6, 2018  (KR) .......................... 10-2018-0135086

(51) Int. Cl.
*H01B 5/00* (2006.01)
*H05K 1/11* (2006.01)
(Continued)

(52) U.S. Cl.
CPC .............. *H01B 5/00* (2013.01); *H05K 1/115* (2013.01); *H05K 3/10* (2013.01); *H05K 1/092* (2013.01);
(Continued)

(58) Field of Classification Search
CPC . H05K 2201/0242; H05K 2201/10325; H05K 1/115
See application file for complete search history.

(56) References Cited

U.S. PATENT DOCUMENTS

2015/0153387 A1* 6/2015 Lee ...................... G01R 1/0466
324/756.02

FOREIGN PATENT DOCUMENTS

KR         10-1586340       1/2016
KR      10-2016-0046621     4/2016
(Continued)

OTHER PUBLICATIONS

KR 101769882 B1 (Translation) (Year: 2023).*
International Search Report dated Jan. 30, 2020 for PCT/KR2019/014008.

*Primary Examiner* — Hoa C Nguyen
*Assistant Examiner* — John B Freal

(57) ABSTRACT

The purpose of the present disclosure is to provide electro-conductive particles and a signal-transmitting connector having same, wherein the electro-conductive particles are improved to prevent the phenomenon of irregular scrub between the electro-conductive particles and to have improved signal delivery characteristics. Electro-conductive particles according to the present disclosure are provided on a signal-transmitting connector having multiple electroconductive portions supported by an insulating portion made of an elastic insulating material to be spaced apart from each other such that the signal-transmitting connector can be (Continued)

connected to an electronic component and can transmit electric signals.

4 Claims, 5 Drawing Sheets

(51) Int. Cl.
 *H05K 1/09* (2006.01)
 *H05K 3/10* (2006.01)
 H05K 3/00 (2006.01)
(52) U.S. Cl.
 CPC ... *H05K 3/0014* (2013.01); *H05K 2201/0242* (2013.01); *H05K 2201/0263* (2013.01); *H05K 2203/104* (2013.01)

(56) References Cited

FOREIGN PATENT DOCUMENTS

| | | | | |
|---|---|---|---|---|
| KR | 101769882 B1 | * | 9/2017 | ........... G01R 1/0466 |
| KR | 101769882 B1 | * | 9/2017 | ........... G01R 1/0466 |
| KR | 10-2018-0051174 | | 5/2018 | |
| KR | 10-1901982 | | 9/2018 | |
| WO | WO 2017-196093 | | 11/2017 | |

* cited by examiner

ELECTROCONDUCTIVE PARTICLES AND SIGNAL-TRANSMITTING CONNECTOR HAVING SAME

This application claims the priority of Korean Patent Application No. 10-2018-0135086, filed on Nov. 6, 2018 in the KIPO (Korean Intellectual Property Office), the disclosure of which is incorporated herein entirely by reference. Further, this application is the National Stage application of International Application No. PCT/KR2019/014008, filed on Oct. 23, 2019, which designates the United States and was published in Korean. Each of these applications is hereby incorporated by reference in their entirety into the present application.

TECHNICAL FIELD

The present disclosure relates to an electro-conductive particle, and more particularly, to an electro-conductive particle provided in an electro-conductive part of a signal transmitting connector connected to an electronic component such as a semiconductor package and used to transmit an electrical signal, and a signal transmitting connector having the same.

BACKGROUND ART

Currently, various types of connectors for transmitting an electrical signal are used in various fields such as an electronics industrial field or a semiconductor industrial field.

As one example, in the case of a semiconductor package, it is manufactured through a pre-process, a post-process, and a test process, and a connector is used in these manufacturing processes. The pre-process is also called a FAB process, and is a process for forming an integrated circuit on a wafer made of single crystal silicon material. The post-process is also called an assembly process, and is a process for forming a semiconductor package by dividing the wafer into respective chips, connecting an electro-conductive lead or ball to the chip to enable electrical signal connection to be formed between the chip and an external device, and molding the chip with resin such as epoxy resin for protecting the chip from an external environment. The test process is a process of testing whether a semiconductor package is operating normally to select a good product and a defective product.

One of the core components applied to the test process is a connector called a test socket. The test socket is mounted on a printed circuit board electrically connected to a tester for testing an integrated circuit, and is used for inspection of a semiconductor package. The tester generates an electrical signal for testing the semiconductor package to be connected to the test socket, outputs it to the semiconductor package, and then tests whether the semiconductor package is operated normally by using the electrical signal input through the test socket. As a result, the semiconductor package is determined as a good product or a defective product.

FIG. 1 is a view illustrating a test socket according to a prior art.

A test socket 10 according to the prior art includes an electro-conductive section 12 which is in contact with a terminal 17 of a semiconductor device 16, and an insulating section 13 serving as an insulating layer between the electro-conductive sections 12.

Upper and lower ends of the electro-conductive section 12 are in contact with the terminal 17 of the semiconductor device 16 and an electro-conductive pad 15 of a test board 14 connected to a test equipment, respectively, to electrically connect the terminal 17 and the electro-conductive pad 15.

The electro-conductive section 12 is formed by mixing electro-conductive particles 12a and silicon rubber 13a and acts as a conductor through which electricity flows. As the electro-conductive particle 12a, an uneven amorphous electro-conductive particle 12a is used.

The electro-conductive section 12 of the conventional test socket 10 is subjected to vertical pressure in order to increase contact characteristics when the electro-conductive section comes into contact with the semiconductor device 16 for testing the semiconductor device. When the electro-conductive section 12 is pressurized, the electro-conductive particle 12a constituting an upper layer is pushed downward, and the electro-conductive particle 12a constituting an intermediate layer is laterally pushed e side little by little.

However, in such the conventional test socket 10, as the electro-conductive section 12 comes repeatedly into contact with the terminal 17 of the semiconductor element 16, irregular movement of the electro-conductive particle 12a in the vertical direction is appeared repeatedly. In addition, the movement of this electro-conductive particle 12a causes an irregular scrub phenomenon between the electro-conductive particles 12a, and if the irregular scrub phenomenon between the electro-conductive particles 12a continues, a plating layer formed on a surface of the electro-conductive particles 12a may be peeled off to deteriorate electrical properties. In addition, the irregular scrub phenomenon between the electro-conductive particles 12a damages the surface of the electro-conductive particle 12a, resulting in a problem that the lifetime of the test socket 10 is shortened.

DISCLOSURE OF THE INVENTION

Technical Problem

The present disclosure is conceived to solve the problems of the prior art as described above, and an object of the present disclosure is to provide an electro-conductive particle which prevents an irregular scrub phenomenon between the electro-conductive particles and is improved to enhance signal transmission characteristics, and a signal transmitting having the same.

Technical Solution

In order to solve the above problems, the present disclosure provides an electro-conductive particle provided in a signal transmitting connector in which a plurality of electro-conductive sections, which may be connected to an electronic component to transmit an electric signal, are supported to be spaced apart from each other by an insulating section formed of an elastic insulating material, this electro-conductive particle may include an electro-conductive particle body having one flat surface and the other flat surface disposed parallel to each other; and a toothed part having a plurality of electro-conductive protrusions protruding outward from an edge of the electro-conductive particle body, each of which having one end being placed at the same height as the one surface the electro-conductive particle body and the other end being placed at the same height as the other surface of the electro-conductive particle body, and a plurality of electro-conductive protrusions, each of which being provided between the electro-conductive protrusions, wherein the electro-conductive particle is disposed in the electro-conductive section to allow the toothed part to be engaged with and electrically connected to the toothed part of other electro-conductive particle in such a way that the electro-conductive particle protrusion is inserted into the electro-conductive particle groove of other electro-conductive particle.

At least a portion of the edge of the electro-conductive particle body may be formed into an arch-shaped curved surface, and the toothed part may be disposed on the arch-shaped curved surface of the edge of the electro-conductive particle body.

The toothed part may be divided into a first toothed part disposed at one end of the electro-conductive particle body and a second toothed part disposed at the other end of the electro-conductive particle body.

The electro-conductive particle body may include a central part, a first arcuate part provided on one end of the central part, and a second arcuate part provided on the other end of the central part, and the first toothed part may be disposed at an edge of the first arcuate part and the second toothed part may be disposed at an edge of the second arcuate part.

The electro-conductive particle body may be formed in a circle-shape or an ellipse-shape.

The electro-conductive particle protrusion may be formed in a shape in which its width becomes narrow as a distance from the electro-conductive particle body is increased, and the electro-conductive particle groove may be formed in a shape in which its width becomes narrow as it approaches the electro-conductive particle body.

In order to solve the above problems, the present disclosure provides a signal transmitting connector which may be connected to an electronic component to transmit an electrical signal, and may include a plurality of electro-conductive sections in which a plurality of electro-conductive particles are aligned in the thickness direction within an elastic insulating material, so as to be connected to a terminal of the electronic component; and an insulating section formed of an elastic insulating material and surrounding and supporting the plurality of electro-conductive sections to space the plurality of electro-conductive sections apart from each other, wherein the electro-conductive particle includes an electro-conductive particle body having one flat surface and the other flat surface disposed parallel to each other; and a toothed part having a plurality of electro-conductive protrusions protruding outward from an edge of the electro-conductive particle body, each of which having one end being placed at the same height as the one surface the electro-conductive particle body and the other end being placed at the same height as the other surface of the electro-conductive particle body, and a plurality of electro-conductive protrusions, each of which being provided between the electro-conductive protrusions, wherein the electro-conductive particle is disposed in the electro-conductive section to allow the toothed part to be engaged with and electrically connected to the toothed part of other electro-conductive particle in such a way that the electro-conductive particle protrusion is inserted into the electro-conductive particle groove of other electro-conductive particle.

ADVANTAGEOUS EFFECTS

The electro-conductive particle according to the present disclosure is provided with the toothed part including the plurality of electro-conductive particle protrusions protruding from the edge of the electro-conductive body and the plurality of electro-conductive particle grooves, each of which being formed between the electro-conductive particle protrusions, and the electro-conductive particle may be thus disposed inside the electro-conductive section so that the toothed part is engaged with the toothed part of other electro-conductive particle. Therefore, a contact area between the electro-conductive particles in the electro-conductive section is increased, so the electrical signal transmission characteristics of the signal transmitting connector may be improved, and the electro-conductive particle is not easily damaged, it is thus possible to extend the lifetime of the signal transmitting connector

BEST MODE FOR CARRYING OUT THE INVENTION

Hereinafter, an electro-conductive particle according to the present disclosure and a signal transmitting connector having the same will be described in detail with reference to the drawings.

Figure 1:
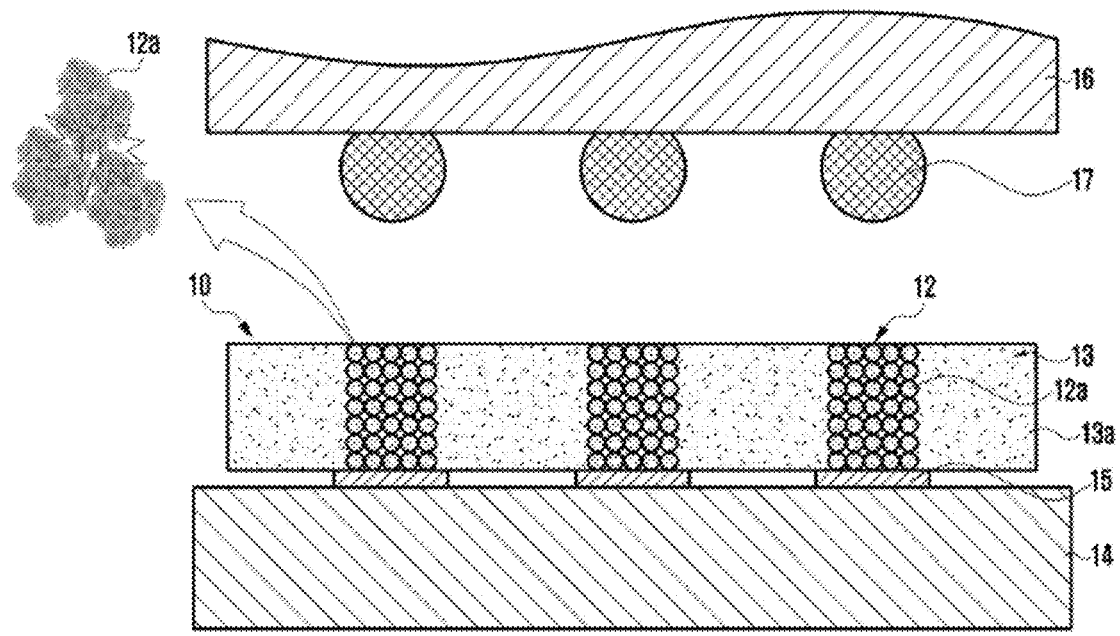
FIG. 1 is a view illustrating a test socket according to a prior art.
Figure 2:
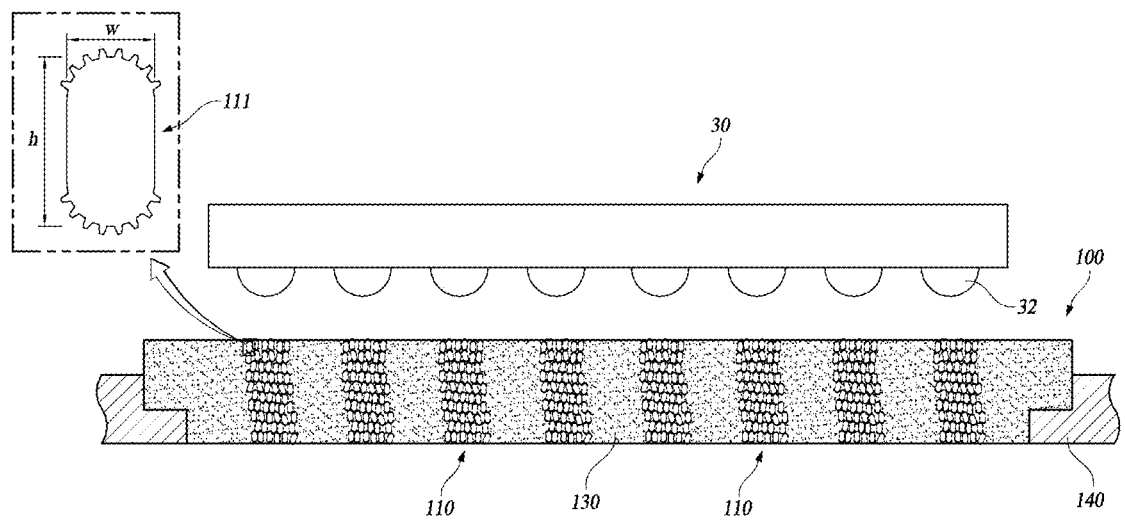
FIG. 2 is a view illustrating a signal transmitting connector according to one embodiment of the present disclosure and an electronic component connected thereto.
Figure 3:
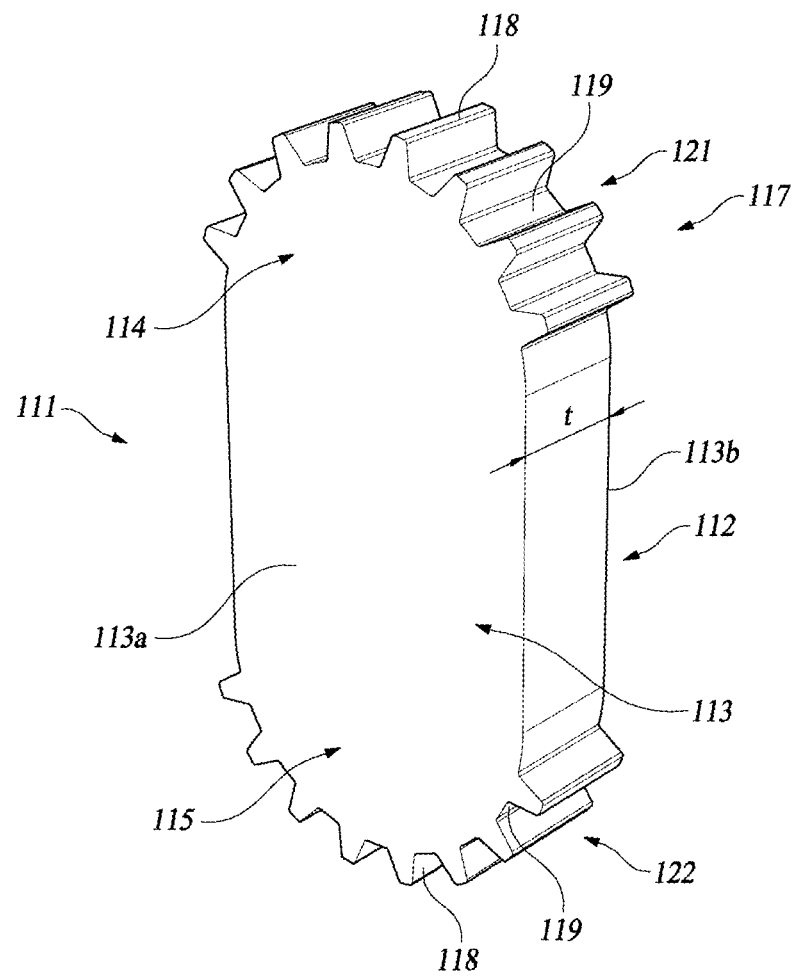
FIG. 3 is a view illustrating an elector-electro-conductive particle provided in the signal transmitting connector according to one embodiment of the present disclosure.

FIG. 2 is a view showing a signal transmitting connector according to one embodiment of the present disclosure and an electronic component connected thereto, and FIG. 3 is a view showing an electro-conductive particle provided in the signal transmitting connector according to one embodiment of the present disclosure.

As shown in the drawings, a signal transmitting connector 100 according to one embodiment of the present disclosure is a device which may be connected to an electronic component 30 to transmit an electric signal, and includes a plurality of electro-conductive sections 110 which may be connected to a terminal 32 of the electronic component 30, an insulating section 130 surrounding and supporting the plurality of electro-conductive sections 110 to space the plurality of electro-conductive sections 110 apart from each other, and a support plate 140 coupled to the insulating sections 130 to support the insulating section 130. This signal transmitting connector 100 is connected to the electronic component 30 and transmits the electrical signal, so it may be used for inspecting of the electronic component through a tester, or for electrically connecting the electronic component and various electronic devices to transmit the electric signal.

The electro-conductive section 110 is formed to have a configuration in which a plurality of electro-conductive particles 111 are aligned within an elastic insulating material in a thickness direction, in order to enable the electro-conductive section to be connected to the terminal 32 of the electronic component 30. The plurality of electro-conductive sections 110 is disposed and spaced apart from each other inside the insulating section 130 so as to correspond to the terminals 32 provided in the electronic component 30 to be connected.

As the elastic insulating material constituting the electro-conductive section 110, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

The electro-conductive particle 111 constituting the electro-conductive section 111 may include an electro-conductive particle body 112 and a toothed part 117, and may be formed of a material having magnetism so that it may be reacted by a magnetic field. For example, as the electro-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electro-conductive magnetic substance such as nickel, cobalt, or the like; or particles obtained by plating core particle with electro-conductive magnetic substance and a metal having excellent electrical-conductivity may be employed.

The electro-conductive particle body 112 of the electro-conductive particle 111 has one flat surface 113a and the other flat surface 113b disposed parallel to each other. The electro-conductive particle body 112 is formed to have a shape in which a width w greater than a thickness t and a length h than the width w so that it may be lengthily erected within the electro-conductive section 110 in the thickness direction of the signal transmitting connector 100. The electro-conductive particle body 112 has a shape in which at least a portion of an edge thereof is formed into an arch-shaped curved surface. That is, the electro-conductive particle body 112 includes a central part 113, a first arcuate part 114 provided on one end of the central part 113 and having an arch shape, and a second arcuate part 115 provided on the other end of the central part 113 and having an arch shape. The first arcuate part 114 and the second arcuate part 115 may be disposed symmetrically with respect to the central part 113 interposed therebetween.

The toothed part 117 of the electro-conductive particle 111 includes a plurality of electro-conductive particle protrusions 118 protruding outward from the edge of the electro-conductive particle body 112, and a plurality of electro-conductive particle grooves 119, each of which being provided between the electro-conductive particle protrusions 118.

The electro-conductive particle protrusion 118 protrudes from the edge of the electro-conductive particle body 112, where one end thereof is placed at the same height as the one surface 113a of the electro-conductive particle body 112, and the other end is placed at the same height as the other surface 113b of the electro-conductive particle body 112. In addition, the electro-conductive particle protrusion 118 is formed in a shape in which its width becomes narrow as a distance from the electro-conductive particle body 112 is increased.

The electro-conductive particle groove 119 is formed between the two adjacent electro-conductive particle protrusions 118 in a shape in which its width becomes narrow as it approaches the electro-conductive particle body 112. The width of the electro-conductive particle groove 119 is greater than the width of the electro-conductive particle protrusion 118 so as to enable the electro-conductive particle protrusion 118 to be inserted into the electro-conductive particle groove 119.

The toothed part 117 may be divided into a first toothed part 121 disposed at one end of the electro-conductive particle body 112 and a second toothed part 122 disposed at the other end of the electro-conductive particle body 112. The first toothed part 121 is provided on the first arcuate part 114 of the electro-conductive particle body 112, and the second toothed part 122 is provided on the second arcuate part 115 of the electro-conductive particle body 112. The first toothed part 121 includes the plurality of electro-conductive particle protrusions 118 protruding outward from an arch-shaped edge of the first arcuate part 114, and the plurality of electro-conductive particle grooves 119, each of which being disposed between the electro-conductive particle protrusions 118. In addition, the second toothed part 122 includes the plurality of electro-conductive particle protrusions 118 protruding outward from an arch-shaped edge of the second arcuate part 114, and the plurality of electro-conductive particle grooves 119, each of which being disposed between the electro-conductive particle protrusions 118.

Figure 4:
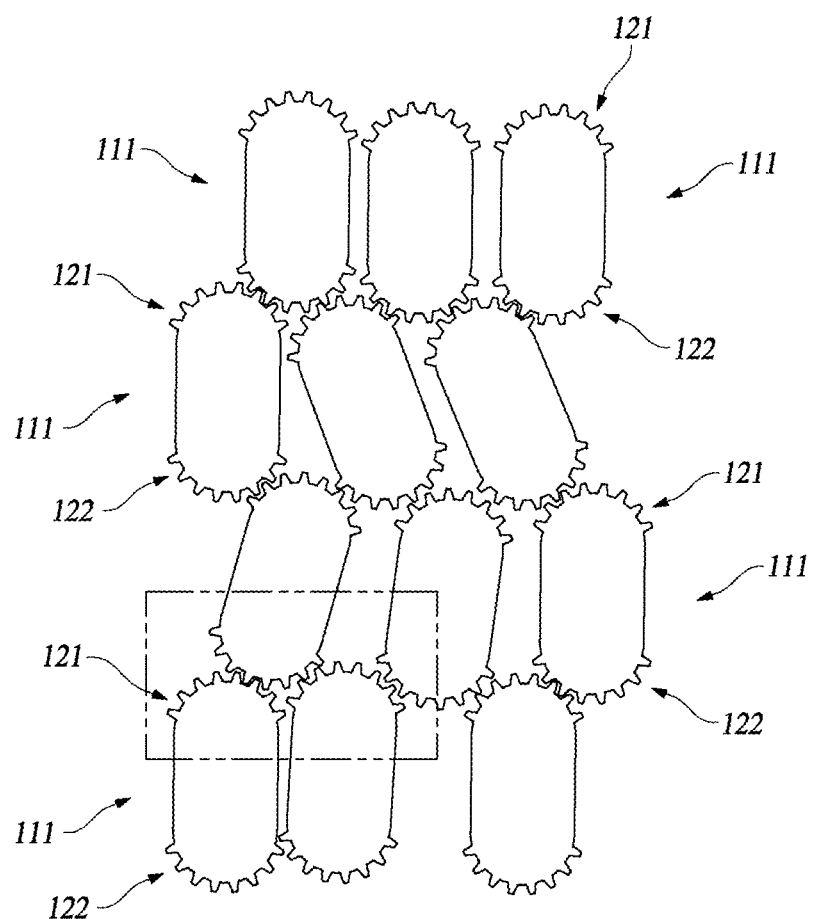
FIG. 4 is a view showing a state in which electro-conductive particles are arranged in an electro-conductive section of the signal transmitting connector according to one embodiment of the present disclosure.

This electro-conductive particle 111 is disposed in the electro-conductive section 110 to allow the toothed part 117 to be engaged with the toothed part 117 of other electro-conductive particle 111 in such a way that the electro-conductive particle protrusion 118 is inserted into the electro-conductive particle groove 119 of other electro-conductive particle 111. As shown in FIGS. 2 and 4, the plurality of electro-conductive particles 111 aligned in the thickness direction of the signal transmitting connector 100 may be electrically connected to each other by mutually engaging the toothed parts 117 of the electro-conductive particles which are vertically adjacent to each other. That is, the first toothed part 121 of the electro-conductive particle 111 disposed at a relatively lower side is engaged with the second toothed part 122 of the electro-conductive particle 111 disposed at a relatively upper side, and the above second toothed part 122 is engaged with the first toothed part 121 of other electro-conductive particle 111 disposed at a relatively lower side.

When the terminal 32 of the electronic component 30 is brought into contact with the electro-conductive section 110 to apply a compressive force to the electro-conductive section 110, the electro-conductive particles 111 constituting the electro-conductive section 110 may come into contact with and be electrically connected to each other to form a path for an electric signal. The electro-conductive particles 111 may be in contact with or finely spaced apart from each other within the electro-conductive section 110, and when the terminal 32 comes into contact with the electro-conductive section 110 and the electro-conductive section 110 is then compressed, the electro-conductive particles 111 may be maintained in a stable mutual contact state to transmit the electric signal.

When the signal transmitting connector 100 is manufactured, the plurality of electro-conductive particles 111 may be aligned in the thickness direction by a magnetic field to constitute the electro-conductive section 110. That is, when a liquid elastic insulating material in which the plurality of electro-conductive particles 111 is contained is injected into a mold and a magnetic field is applied to an interior of the mold, the electro-conductive particles 111 are concentrated to a portion where the magnetic field is a relatively strong. At this time, due to the influence of the magnetic field, the electro-conductive particles 111 are arranged to be lengthily erected in the thickness direction. That is, when the magnetic field is applied, the electro-conductive particles 111 are erected and aligned in the magnetic field direction.

Figure 5:
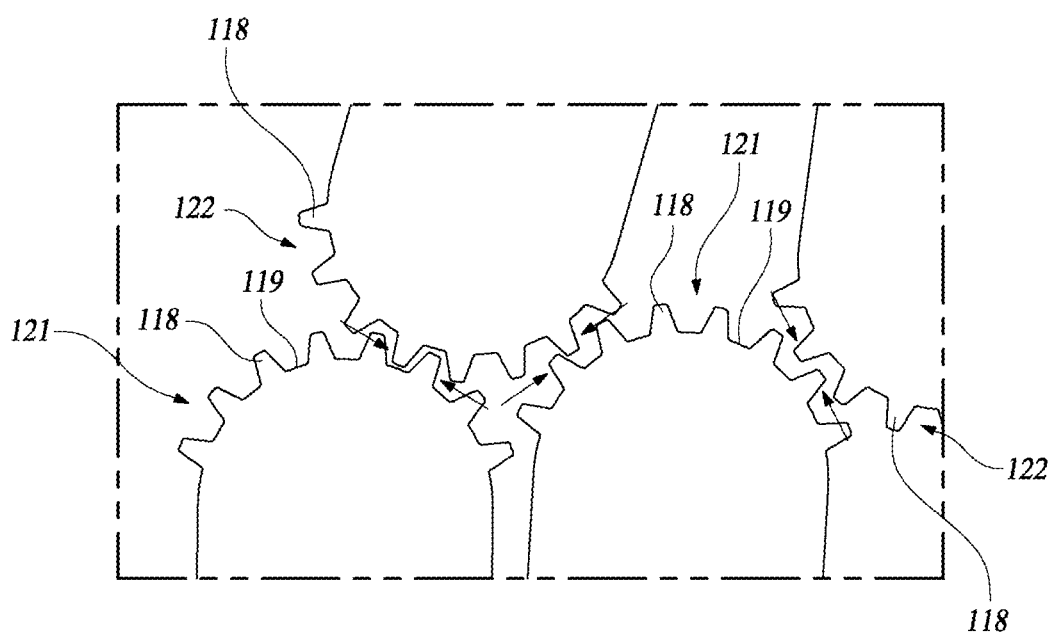
FIG. 5 is an enlarged view of a part of FIG. 4.

When the electro-conductive particles 111 are located within the magnetic field, as shown in FIG. 5, a magnetic force is generated in the toothed part 117, an attraction force is applied between the toothed part 117 and the toothed part 117 of other electro-conductive particle 111, so end portions of the vertically adjacent electro-conductive particles 111 are docked with each other. Accordingly, a coupling force between the electro-conductive particles 111 is increased, and the electro-conductive particles 111 may be smoothly aligned so that the toothed parts 117 thereof are engaged with each other.

Moreover, since the plurality of electro-conductive particle protrusions 118 and the plurality of electro-conductive particle grooves 119 constituting the first toothed part 121 or the second toothed part 122 are disposed along the arch-shaped edge of each of the first arcuate part 114 or the second arcuate part 115 of the electro-conductive particle body 112, the first toothed part 121 or the second toothed part 122 provided on one electro-conductive particle 111 may be engaged with the toothed part 117 of the plurality of other electro-conductive particles 111. That is, the electro-conductive particle 111 may be engaged with not only other electro-conductive particles 111 disposed thereabove and theerebelow in a straight line, but also other electro-conductive particles 111 disposed below and above it in a somewhat inclined state. Accordingly, a contact area of the electro-conductive particle 111 may be increased, thereby enabling more stable signal transmission.

Since, as described above, the electro-conductive particles 111 are disposed in the electro-conductive section 110 so that the toothed part 117 is engaged with the toothed part 117 of other electro-conductive particle, it is possible to mitigate problems in that, as in the prior art, an irregular scrub phenomenon between the electro-conductive particles is occurred, a surface of the electro-conductive particle is damaged by the irregular scrub phenomenon between the electro-conductive particles, or a plating layer of the electro-conductive particle is peeled off to deteriorate electrical properties.

The insulating section 130 may be formed of an elastic insulating material. The insulating section 130 surrounds the plurality of electro-conductive sections 110 and supports the plurality of the electro-conductive sections 110 so as to be spaced apart from each other. The elastic insulating material constituting the insulating section 130 may be the same material as the elastic insulating material constituting the electro-conductive section 110.

The support plate 140 may be made of various materials having rigidity enough to stably maintain a shape thereof without being easily deformed while stably supporting the insulating section 130 having elasticity. For example, the support plate 140 may be made of a material such as synthetic resin, metal, ceramic, or the like. When the support plate 140 is made of metal, a surface of the support plate 140 may be coated with an insulating film.

As described above, in the signal transmitting connector 100 according to one embodiment of the present disclosure, the electro-conductive particle 111 forming the electro-conductive section 110 is provided with the toothed part 117 comprising the plurality of electro-conductive particle protrusions 118 protruding outward from the edge of the electro-conductive particle body 112 and the plurality of electro-conductive particle grooves 119, each of which being formed between the electro-conductive particle protrusions 118, and the plurality electro-conductive particles 111 are disposed inside the electro-conductive section 110 so that the toothed parts 117 of the electro-conductive particles are engaged with each other. Therefore, compared to the prior art, the contact area between the electro-conductive particles 111 in the electro-conductive section 110 is large, so the electrical signal transmission characteristics are excellent, and since irregular scrub phenomenon between the electro-conductive particles 111 occurred in the prior art does not occur, excellent signal transmission efficiency may be maintained even when used for long time.

Figure 6:
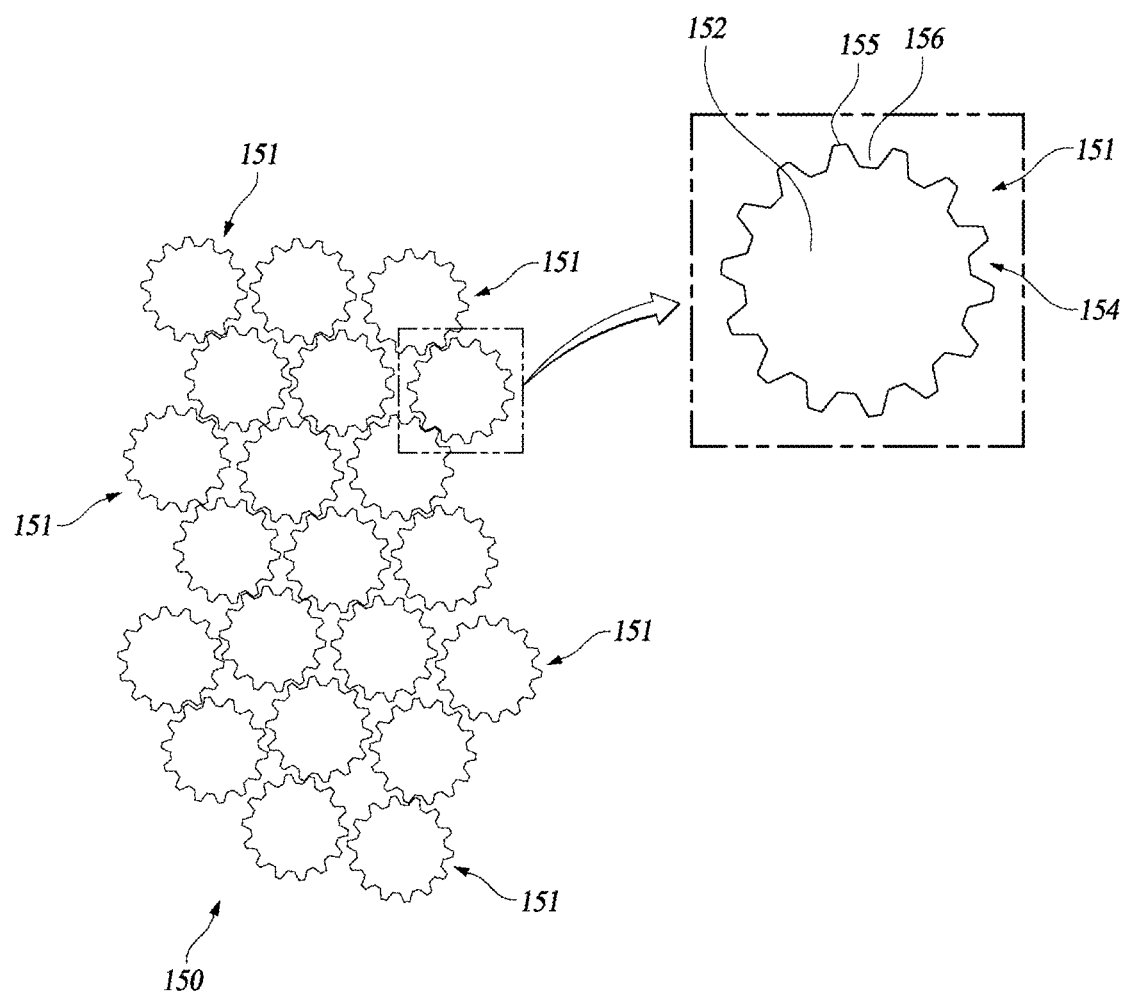
FIG. 6 is a view showing a state in which electro-conductive particles according to another embodiment of the present disclosure are arranged in an electro-conductive section.

On the other hand, FIG. 6 shows a state in which electro-conductive particles according to another embodiment of the present disclosure are arranged in an electro-conductive section.

An electro-conductive particle 151 shown in FIG. 6 includes an electro-conductive particle body 152 and a toothed part 154 disposed on an edge of the electro-conductive particle body 152. The plurality of electro-conductive particles 151 described above are connected to be in contact with each other, thereby forming an electro-conductive section 150.

The electro-conductive particle body 152 is formed in a circular shape, in which a width is greater than a thickness to enable it to be lengthily erected within the electro-conductive section 150 in the thickness direction and both flat side surfaces are disposed in parallel to each other.

The toothed part 154 includes a plurality of electro-conductive particle protrusions 155 protruding outward from the edge of the electro-conductive particle body 152, and a plurality of electro-conductive particle grooves 156, each of which being provided between the electro-conductive particle protrusions 155.

The electro-conductive particle protrusion 155 protrudes from the edge of the electro-conductive particle body 152, where one end thereof is placed at the same height as one surface of the electro-conductive particle body 152, and the other end is placed at the same height as the other surface of the electro-conductive particle body 152. In addition, the electro-conductive particle protrusion 155 is formed in a shape in which its width becomes narrow as a distance from the electro-conductive particle body 152 is increased.

The electro-conductive particle groove 156 is formed between the two adjacent electro-conductive particle protrusions 155 in a shape in which its width becomes narrow as it approaches the electro-conductive particle body 152. The width of the electro-conductive particle groove 156 is greater than the width of the electro-conductive particle protrusion 155 so as to enable the electro-conductive particle protrusion 155 of other electro-conductive particle 151 to be inserted into the electro-conductive particle groove 156.

This electro-conductive particle 151 is disposed in the electro-conductive section 150 to allow the toothed part 154 to be engaged with the toothed part 154 of other electro-conductive particle 151 in such a way that the electro-conductive particle protrusion 155 is inserted into the electro-conductive particle groove 156 of other electro-conductive particle 151. In the electro-conductive section 150, the plurality of electro-conductive particles 151 may be electrically connected to each other by mutually engaging the toothed parts 154 of the electro-conductive particles which are vertically adjacent to each other.

Since the above electro-conductive particles 151 are disposed in the electro-conductive section 150 so that the toothed part 154 is engaged with the toothed part 154 of other electro-conductive particle 151, a contact area between the electro-conductive particles 151 in the electro-conductive section 150 is large, so an electrical signal transmission characteristic is excellent, and irregular scrub phenomenon between the electro-conductive particles 151 does not occur, so the electro-conductive particle has a long lifetime.

In particular, since the toothed part 154 of the electro-conductive particle 151 is disposed along the edge of the circular-shaped electro-conductive particle body 152, one electro-conductive particle 151 may be electrically connected to a plurality of electro-conductive particles 151 adjacent thereto. That is, the electro-conductive particle 151 may be engaged with not only other electro-conductive particles 151 disposed thereabove and therebelow in a straight line, but also the plurality of electro-conductive particles 151 disposed therearound, so it is possible to form more extended electrical signal path in the electro-conductive section 150.

Figure 7:
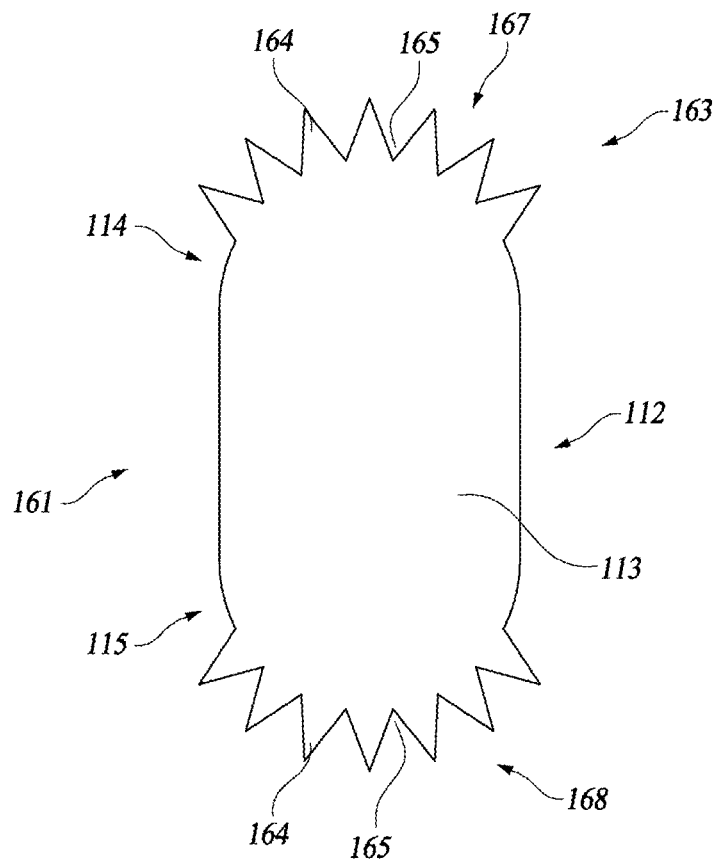
FIGS. 7 and 8 are views showing various modified examples of an electro-conductive particle according to the present disclosure.
Figure 8:
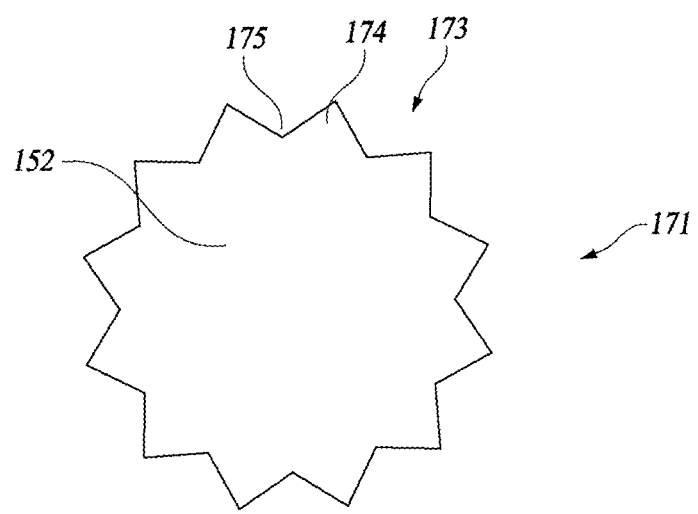

Meanwhile, FIGS. 7 and 8 show various modified examples of the electro-conductive particle according to the present disclosure.

First, an electro-conductive particle 161 shown in FIG. 7 includes the electro-conductive particle body 112 and a toothed part 163. The electro-conductive particle body 112 is the same as that shown in FIGS. 2 to 4 and is formed to have a configuration in which a width is greater than a thickness and a length is greater than the width. The electro-conductive particle body 112 includes the central part 113, the first arcuate part 114 provided at one end of the central part 113 and having an arch shape, and the second arcuate part 115 provided at the other end of the central part 113 and having an arch shape.

The toothed part 163 includes a plurality of electro-conductive particle protrusions 164 protruding outward from the edge of the electro-conductive particle body 112, and a plurality of electro-conductive particle grooves 165, each of which being provided between the electro-conductive particle protrusions 164. A width of the electro-conductive particle protrusion 164 becomes narrow as a distance from the electro-conductive particle body 112 is increased, so the electro-conductive particle protrusion has a pointed shape. The electro-conductive particle groove 165 is formed between the two adjacent electro-conductive particle protrusions 164 in a shape in which its width becomes narrow as it approaches the electro-conductive particle body 112. The toothed part 163 is divided into a first toothed part 167 provided on the first arcuate part 114 of the electro-conductive particle body 112 and a second toothed part 168 provided on the second arcuate part 115 of the electro-conductive particle body 112.

The above-described electro-conductive particle 161 is also connected to other electro-conductive particle 161 to allow the toothed part 163 to be engaged with the toothed part 163 of other electro-conductive particle 161 in such a way that the electro-conductive particle protrusion 164 is inserted into the electro-conductive particle groove 165 of other electro-conductive particle 161, so it is possible to form the electro-conductive section having excellent signal transmission characteristic. In addition, since the toothed part 163 is provided on an arch-shaped curved surface of the edge of the electro-conductive particle body 112, this toothed part may be engaged with the plurality of electro-conductive particles 161 to form an extended electrical signal path within the electro-conductive section.

An electro-conductive particle 171 shown in FIG. 8 includes the electro-conductive particle body 152 and a toothed part 173 disposed on the edge of the electro-conductive particle body 152. The plurality of electro-conductive particles 171 described above may be connected so as to be in contact with each other, thereby form an electro-conductive section.

Like the electro-conductive particle 151 shown in FIG. 6, the electro-conductive particle body 152 is formed in a circular shape having both flat side surface disposed parallel to each other.

The toothed part 173 includes a plurality of electro-conductive particle protrusions 174 protruding outward from the edge of the electro-conductive particle body 152, and a plurality of electro-conductive particle grooves 175, each of which being provided between the electro-conductive particle protrusions 174. The electro-conductive particle protrusion 174 protrudes from the edge of the electro-conductive particle body 152, wherein a width thereof becomes narrow as a distance from the electro-conductive particle body 152 is increased, so the electro-conductive particle protrusion has a pointed shape. The electro-conductive particle groove 175 is formed between the two electro-conductive particle protrusions 174 in a shape in which its width becomes narrow as it approaches the electro-conductive particle body 152.

This electro-conductive particle 171 is also connected to other electro-conductive particle 171 to allow the toothed part 173 to be engaged with the toothed part 173 of other electro-conductive particle 171 in such a way that the electro-conductive particle protrusion 174 is inserted into the electro-conductive particle groove 175 of other electro-conductive particle 171, so it is possible to form the electro-conductive section having excellent signal transmission characteristic. In addition, since the toothed part 173 is provided on the edge of the circular-shaped electro-conductive particle body 152, it may be engaged with the plurality of electro-conductive particles 171 disposed around the electro-conductive particle 171 to form an electrical signal path that is extended within the electro-conductive section.

Although a preferred example has been described above for the present disclosure, the scope of the present disclosure is not limited to the form described and illustrated above.

For example, although it has been previously described that the electro-conductive particle body of the electro-conductive particle has a flat plate-shape with the width greater than the thickness and the length greater than the width, in addition to the flat plate-shape, the electro-conductive particle body may be modified to have various other shapes having both side surfaces parallel to each other, such as a block shape or the like. In addition, the electro-conductive particle body may take various shapes, such as a circle-shape or an ellipse-shape.

In addition, even though the drawings show that the electro-conductive particle protrusion of the electro-conductive particle is formed in a shape in which its width becomes narrow as a distance from the electro-conductive particle body is increased and the electro-conductive particle groove is formed in a shape in which its width becomes narrow as it approaches the electro-conductive particle body, the electro-conductive particle protrusion or the electro-conductive particle groove may be modified to have to various other shapes.

In the above, the present disclosure has been illustrated and described in connection with a preferred embodiment for illustrating the principle of the present disclosure, but the present disclosure is not limited to the configuration and operation as shown and described as such. Rather, it will be well understood by those skilled in the art that many changes and modifications can be made to the present disclosure without departing from the spirit and scope of the appended claims.

The invention claimed is:

1. An electro-conductive particle provided in a signal transmitting connector in which a plurality of electro-conductive sections, which may be connected to an electronic component to transmit an electric signal, are supported to be spaced
apart from each other by an insulating section formed of an elastic insulating material, the electro-conductive particle comprising:
an electro-conductive particle body having one flat surface and the other flat surface disposed parallel to each other; and
a toothed part having a plurality of electro-conductive particle protrusions protruding outward from an edge of the electro-conductive particle body, each of which having one end being placed at the same height as the one surface the electro-conductive particle body and the other end being placed at the same height as the other surface of the electro-conductive particle body, and a plurality of electro-conductive particle grooves, each of which being provided between the electro-conductive particle protrusions,
wherein the electro-conductive particle is disposed in the electro-conductive section to allow the toothed part to be engaged with and electrically connected to the toothed part of other electro-conductive particle in such a way that the electro-conductive particle protrusion is inserted into the electro-conductive particle groove of other electro-conductive particle,
wherein the electro-conductive particle body has a central part having a width (w) greater than a thickness (t), a length (h) greater than the width (w), and a constant width (w), and one end of the central part is provided in an arcuate shape comprising a first arcuate part and a second arcuate part provided in an arcuate shape at another end of the central part,
wherein the toothed part is divided into a first toothed part disposed at an edge of the first arcuate part and a second toothed part is disposed at an edge of the second arcuate part,
wherein the plurality of electro-conductive particle protrusions and the plurality of electro-conductive particle grooves of the first toothed part are sequentially disposed along the edge of the first arcuate part, and the plurality of conductive particle projections and the plurality of conductive particle grooves of the second toothed part are sequentially disposed along the edge of the second arcuate part.

2. The electro-conductive particle of claim 1, wherein the electro-conductive particle protrusion is formed in a shape in which its width becomes narrow as a distance from the electro-conductive particle body is increased, and the electro-conductive particle groove is formed in a shape in which its width becomes narrow as it approaches the electro-conductive particle body.

3. A signal transmitting connector which may be connected to an electronic component to transmit an electrical signal, comprising:
a plurality of electro-conductive sections in which a plurality of electro-conductive particles is aligned in the thickness direction within an elastic insulating material, so as to be connected to a terminal of the electronic component; and
an insulating section formed of an elastic insulating material and surrounding and supporting the plurality of electro-conductive sections to space the plurality of electro-conductive sections apart from each other,
wherein the electro-conductive particle comprises:
an electro-conductive particle body having one flat surface and the other flat surface disposed parallel to each other; and
a toothed part having a plurality of electro-conductive particle protrusions protruding outward from an edge of the electro-conductive particle body, each of which having one end being placed at the same height as the one surface the electro-conductive particle body and the other end being placed at the same height as the other surface of the electro-conductive particle body, and a plurality of electro-conductive particle grooves, each of which being provided between the electro-conductive particle protrusions,
wherein the electro-conductive particle is disposed in the electro-conductive section to allow the toothed part to be engaged with and electrically connected to the toothed part of other electro-conductive particle in such a way that the electro-conductive particle protrusion is inserted into the electro-conductive particle groove of other electro-conductive particle,
wherein the electro-conductive particle body has a central part having a width (w) greater than a thickness (t), a length (h) greater than the width (w), and a constant width (w), and one end of the central part is provided in an arcuate shape comprising a first arcuate part and a second arcuate part provided in an arcuate shape at another end of the central part,
wherein the toothed part is divided into a first toothed part disposed at an edge of the first arcuate part and a second toothed part is disposed at an edge of the second arcuate part,
wherein the plurality of electro-conductive particle protrusions and the plurality of electro-conductive particle grooves of the first toothed part are sequentially disposed along the edge of the first arcuate part, and the plurality of conductive particle projections and the plurality of conductive particle grooves of the second toothed part are sequentially disposed along the edge of the second arcuate part.

4. The signal transmitting connector of claim 3, wherein the electro-conductive particle protrusion is formed in a shape in which its width becomes narrow as a distance from the electro-conductive particle body is increased, and the electro-conductive particle groove is formed in a shape in which its width becomes narrow as it approaches the electro-conductive particle body.

* * * * *